US008004272B2

(12) United States Patent  (10) Patent No.: US 8,004,272 B2
Jamieson et al.  (45) Date of Patent: Aug. 23, 2011

(54) DIGITAL MULTIMETER HAVING VISIBLE LIGHT COMMUNICATION PORT

(75) Inventors: Richard Michael Jamieson, Everett, WA (US); Richard J. Kowalsky, Marysville, WA (US); Richard Dale Szabo, Mukilteo, WA (US); Jody Kroehler Magnuson, Mercer Island, WA (US)

(73) Assignee: Fluke Corporation, Everett, WA (US)

( * ) Notice: Subject to any disclaimer, the term of this patent is extended or adjusted under 35 U.S.C. 154(b) by 136 days.

(21) Appl. No.: 12/401,742

(22) Filed: Mar. 11, 2009

(65) Prior Publication Data

US 2010/0231197 A1  Sep. 16, 2010

(51) Int. Cl.
*G01R 15/00*  (2006.01)
(52) U.S. Cl. ........................................ 324/115
(58) Field of Classification Search ................... None
See application file for complete search history.

(56) References Cited

U.S. PATENT DOCUMENTS

| | | | | |
|---|---|---|---|---|
| 5,475,300 | A * | 12/1995 | Havel | 324/115 |
| 5,640,155 | A | 6/1997 | Springer | |
| 6,043,640 | A * | 3/2000 | Lauby et al. | 324/127 |
| 6,622,109 | B2 | 9/2003 | Ermer et al. | 702/145 |
| 7,075,289 | B2 | 7/2006 | Chen | |
| 7,259,567 | B2 * | 8/2007 | Sears et al. | 324/508 |
| 7,626,375 | B2 * | 12/2009 | Garland et al. | 324/115 |
| 7,679,356 | B2 * | 3/2010 | Garland et al. | 324/115 |
| 2004/0160410 | A1 | 8/2004 | Plathe | |
| 2005/0246295 | A1 | 11/2005 | Cameron | |
| 2007/0241740 | A1 | 10/2007 | Hawes | |
| 2009/0045799 | A1 * | 2/2009 | Garland et al. | 324/115 |
| 2009/0045800 | A1 * | 2/2009 | Garland et al. | 324/115 |
| 2009/0128124 | A1 * | 5/2009 | Garland et al. | 324/115 |
| 2009/0128125 | A1 * | 5/2009 | Garland et al. | 324/115 |
| 2009/0128126 | A1 * | 5/2009 | Garland et al. | 324/115 |
| 2009/0128127 | A1 * | 5/2009 | Garland et al. | 324/115 |
| 2009/0128128 | A1 * | 5/2009 | Garland et al. | 324/115 |
| 2009/0140721 | A1 * | 6/2009 | Garland et al. | 324/115 |
| 2010/0181990 | A1 * | 7/2010 | Hudson et al. | 324/115 |
| 2011/0074395 | A1 * | 3/2011 | Marzynski et al. | 324/114 |

OTHER PUBLICATIONS

Fluke Corporation, Fluke 115 Multimeter Technical Data, Aug. 2006.
Fluke Corporation, 87 & 89 Series IV Multimeter Service Manual, May 1999.

* cited by examiner

*Primary Examiner* — Jermele M Hollington
(74) *Attorney, Agent, or Firm* — Nelson Mullins Riley & Scarborough, LLP

(57) ABSTRACT

A digital multimeter can be monitored from a remote location via an on-board light source such as a backlight LED. The digital multimeter has memory, a processor operatively coupled to the memory, a light operatively coupled to the processor and the memory and a light sensitive sensor operatively coupled to the machinery and positioned proximate the light. The processor is configured to produce a first data signal containing information about the machinery, which is then modulated by the light so that the light blinks between an on state and an off state. The sensor is configured to detect the light on state and the light off state and convert the received light into a second data signal representative of the first data signal.

26 Claims, 4 Drawing Sheets

DIGITAL MULTIMETER HAVING VISIBLE LIGHT COMMUNICATION PORT

FIELD OF THE INVENTION

The present invention relates to the art of digital multimeters. More particularly, the present invention relates remote monitoring of a digital multimeter display for communicating information.

BACKGROUND

Multimeters are used for measuring a variety of parameters associated with electrical circuitry, such as currents, voltages, resistance and capacitance. A multimeter can be a handheld device useful for basic fault finding and field service work or a sophisticated bench instrument that can measure with a very high degree of accuracy. The instrument may be implemented with an analog meter deflected by an electromagnet or with a digital display such as an LCD (liquid crystal display) screen.

Portable digital multimeters (DMMs) commonly include a rotary switch configured such that each rotated position of the rotary switch indicates a different measuring function. For example, a rotary switch on a conventional DMM may be configured such that a first position corresponds to a voltage measurement, a second position corresponds to a current measurement, and a third position corresponds to a resistance measurement. In this manner, a single instrument can act as a voltmeter, an ammeter, or an ohmmeter by simply rotating a switch.

Accordingly, DMMs incorporate various tools for performing different types of measurements and different capabilities for displaying measurement values in a digital format on a screen. Further capabilities and improvements are needed to enable users to receive measurement information remotely.

The present invention recognizes and addresses the foregoing considerations, and others, of prior art constructions and methods.

SUMMARY OF THE INVENTION

The present invention recognizes and addresses disadvantages of prior art constructions and methods. Certain other objects of the present invention may be achieved by a digital multimeter comprising a processor, a selector for choosing measurement criteria, the selector being operatively coupled to the processor, an input operatively coupled to the processor, the input being configured to monitor a device, and a backlit display operatively coupled to the processor. The processor is configured to produce a first data signal containing information about the device being monitored, where the first data signal is modulated by the backlit display to produce an optical indicator that blinks between a first state and a second state that differs from the first state so that a sensor may detect the first and second states.

In some embodiments, a sensor is operatively coupled to the digital multimeter proximate the display, where the sensor is configured to detect the first and the second states and generate a second data signal representative of the first modulated data signal.

In yet other embodiments, the sensor is a light sensitive sensor comprising a photovoltaic sensor, an amplifier coupled to an output of the photovoltaic sensor, a comparator coupled to an output of the amplifier and a signal converter coupled to an output of the comparator and configured to convert the output signal of the comparator into a common interface signal.

In some embodiments, a light emitting diode backlights the display.

In another embodiment of the present invention, a remote monitoring apparatus comprises machinery to be monitored from a remote location, the machinery having memory, a processor operatively coupled to the memory, a light operatively coupled to the processor and the memory and a light sensitive sensor operatively coupled to the machinery and positioned proximate the light. The processor is configured to produce a first data stream containing information about the machinery, which is then modulated by the light so that the light blinks between an on state and an off state. The sensor is configured to detect the light on state and the light off state and convert the received light into a second data stream representative of the first data stream.

In some embodiments, the machinery further comprises a display, and the light is operatively coupled to the display and operates as a backlight for the display. In other embodiments, the machinery is a digital multimeter comprising a display, wherein the light operates as a backlight for the display. In some embodiments, the light is a light emitting diode.

In some embodiments, the light sensitive sensor further comprises a photovoltaic sensor, an amplifier coupled to an output of the photovoltaic sensor, a comparator coupled to an output of the amplifier and a signal converter coupled to an output of the comparator and configured to convert the output signal of the comparator into a common interface signal. The common interface signal may be RS232 ASCII. The signal converter may be a level shifter, and in some embodiments, a low pass filter may be intermediate the photovoltaic sensor and at least one input of the amplifier.

In another embodiment of the present invention, a remote measuring device comprises a measuring device having a processor, memory operatively coupled to the processor, an input operatively coupled to the processor, the input configured to measure a desired parameter of interest to the user, a display operatively coupled to the processor and configured to display measurement data and a backlight operatively coupled to the processor and configured to modulate a first data stream by switching between an on state and an off state in response to command signals from the processor. This embodiment further comprises a first light sensitive sensor operatively coupled to the measuring device proximate the backlight, wherein the sensor is configured to detect the light on state and the light off state and convert the received light into a second data stream representative of the first data stream.

In some embodiments, the measuring device is a digital multimeter and the light is a light emitting diode.

In some embodiments, the light sensitive sensor further comprises a photovoltaic sensor, an amplifier coupled to an output of the photovoltaic sensor, a comparator coupled to an output of the amplifier and a signal converter coupled to an output of the comparator and configured to convert the output signal of the comparator into a common interface signal. The common interface signal may be RS232 ASCII. The signal converter may be a level shifter.

In yet other embodiments, the measuring device further comprises a second light sensitive sensor for detecting a second light operatively coupled to the first light sensitive sensor. In some embodiments, the light emitting diode is configured to operate as the second light sensitive sensor. In some embodiments, the remote measuring device operates in a full duplex mode by sending and receiving data signals via the light emitting diode. In other embodiments, the second light sensitive sensor is a photovoltaic sensor operatively coupled to the processor.

In some embodiments, a computer is coupled to the first light sensitive sensor and is configured to receive the second data signal. In other embodiments, the signal converter is a radio frequency signal microchip.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
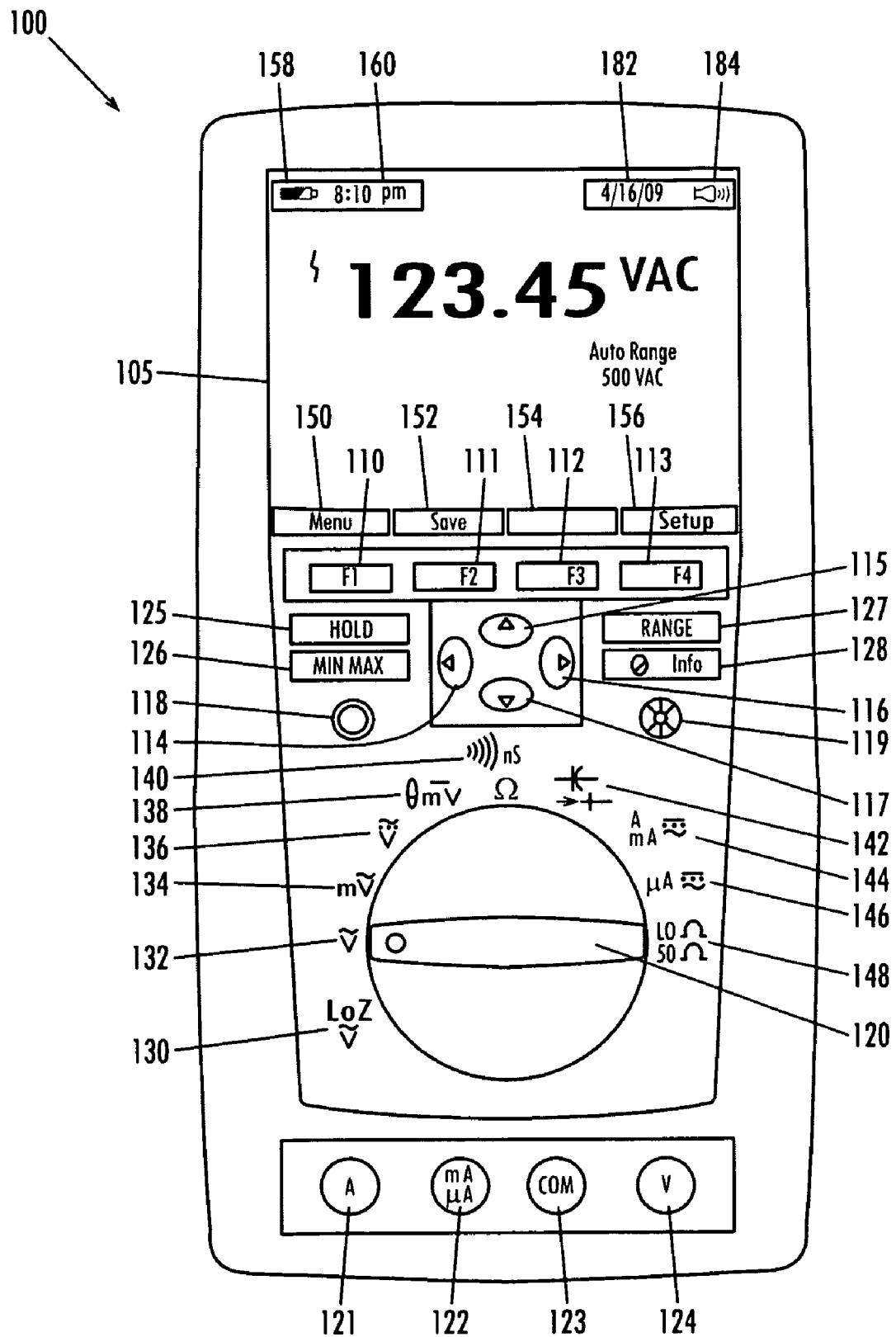
FIG. 1 illustrates a front plan view of a DMM in accordance with one embodiment of the present invention.

Repeat use of reference characters in the present specification and drawings is intended to represent same or analogous features or elements of the invention according to the disclosure.

DETAILED DESCRIPTION

Reference will now be made in detail to presently preferred embodiments of the invention, one or more examples of which are illustrated in the accompanying drawings. Each example is provided by way of explanation, not limitation, of the invention. It is to be understood by one of ordinary skill in the art that the present discussion is a description of exemplary embodiments only, and is not intended as limiting the broader aspects of the present invention, which broader aspects are embodied in the exemplary constructions. In fact, it will be apparent to those skilled in the art that modifications and variations can be made in the present invention without departing from the scope and spirit thereof. For instance, features illustrated or described as part of one embodiment may be used on another embodiment to yield a still further embodiment. Thus, it is intended that the present invention covers such modifications and variations as come within the scope of the appended claims and their equivalents.

Embodiments of the present invention provide an apparatus for remote monitoring of a measurement device. One example of a measuring device for use in the present invention is a digital multimeter (DMM) used for testing products and devices during manufacturing and operation. Referring to FIG. 1, a digital multimeter 100 is shown having a display area 105, a rotary switch 120, soft keys 110-113, navigation buttons 114-117, dedicated buttons 125-128, and various input jacks 121-124. Multimeter 100 can be powered by four AA alkaline batteries (not shown) or other suitable source of electrical power. A user can configure the device as desired by utilizing the multi-function buttons, dedicated buttons or "soft key" buttons corresponding to display 105. Output can be presented to the user with display 105, an indicator light, and/or an audible beeper. Multimeter 100 can include an internal memory for storing information, such as measurement values. DMM 100 includes a backlight for display 105 to allow improved viewing in conditions of reduced light. The backlight is activated by backlight control button 119. DMM 100 can also include an On/Off button 118 used to turn the DMM on or off.

Analog connections on input jacks 121-124 can be used to provide input to be measured by DMM 100. As shown in FIG. 1, four input jacks 121-124 can be included along the bottom of DMM 100, where the user connects input probes used to measure signals of interest. Output can be presented to the user with display 105, an indicator light, and/or an audible beeper. DMM 100 may include an internal memory 230 for storing information, such as measurement values.

Soft keys 110-113 can be located in an area beneath display 105 and positioned to correspond with labels (not shown) on the display. Navigation buttons 114-117 can be centrally located among the other buttons of multimeter 100. Navigation buttons 114-117 correspond to four cardinal directions: up 115, down 117, left 114 and right 116. Navigation buttons 114-117 are used to move within menus and dialogs and to make choices and perform data entry. Info button 128 can provide access to context-sensitive information about the measurement function and display contents.

Each position of rotary switch 120 corresponds to at least one different function. Rotary switch 120 includes positions 130, 132, 134, 136, 138, 140, 142, 144, 146, and 148. The functions are indicated by symbols surrounding rotary switch 120. Rotary switch 120 can include functions such as: AC voltage measurement from 0 V to 1000.0 V, AC millivolt measurement from 0 mV to 3000.0 mV, DC voltage measurement from 0 V to 1000.0 V, DC millivolt measurement from 0 mV to 3000.0 mV, resistance measurement from 0 Ω to 500.0 MΩ, capacitance measurement from 0.001 nF to 50 mF, temperature measurement, AC current measurements from 0 mA to 20.000 A, AC current measurements from 0 μA to 5000.0 μA, DC current measurements from 0 mA to 20.000 A, DC current measurements from 0 μA to 5000.0 μA. Each position of rotary switch 120 can also correspond to a specific screen displaying pertinent information to the function in use. As shown in FIG. 1, some positions of rotary switch 120 may include more than one symbol, in which case the symbol closest to rotary switch 120 is the default measuring function. Where only one symbol corresponds to a position, that symbol denotes the default measuring function. A menu item in rotary switch positions can provide one or more virtual buttons corresponding to soft keys 110-113 to allow the user to select between primary functions available within the rotary switch position.

Dedicated buttons 125-128 provide direct single-press access to measurement modes. For example, HOLD button 125 can be used to hold the currently displayed measurement value. MIN MAX 126 button can be used to capture the highest, lowest, and average readings over time. RANGE button 127 can be used to manually select a measurement range. Other modes may be selected by using soft keys 110-113 and navigation buttons 115-117 to make selections from menus on display 105.

In the example shown in FIG. 1, rotary switch 120 can remain in its current position when DMM 100 is turned off and back on using separate ON/OFF button 118. This method of turning DMM 100 on and off allows the DMM to be turned off and back on without losing track of the presently active measurement function, including any selected secondary function or modes. When rotary switch 120 is turned from one function to another, a display for the new function appears on display 105. In some embodiments, button choices made in one function do not carry over into another function.

Display 105 may be an LCD screen or any other suitable type of display. In the illustrated embodiment, rotary switch 120 is set to the V AC position, and so display 105 exhibits a V AC measurement 134. The measurement may be displayed in a bold type and/or in a comparatively larger font size in relation to other displayed measurements to indicate which measurement is the primary measurement. Display 105 may further exhibit a secondary measurement, which is a measurement on the display representing an additional function shown concurrently with the primary measurement.

Figure 2:
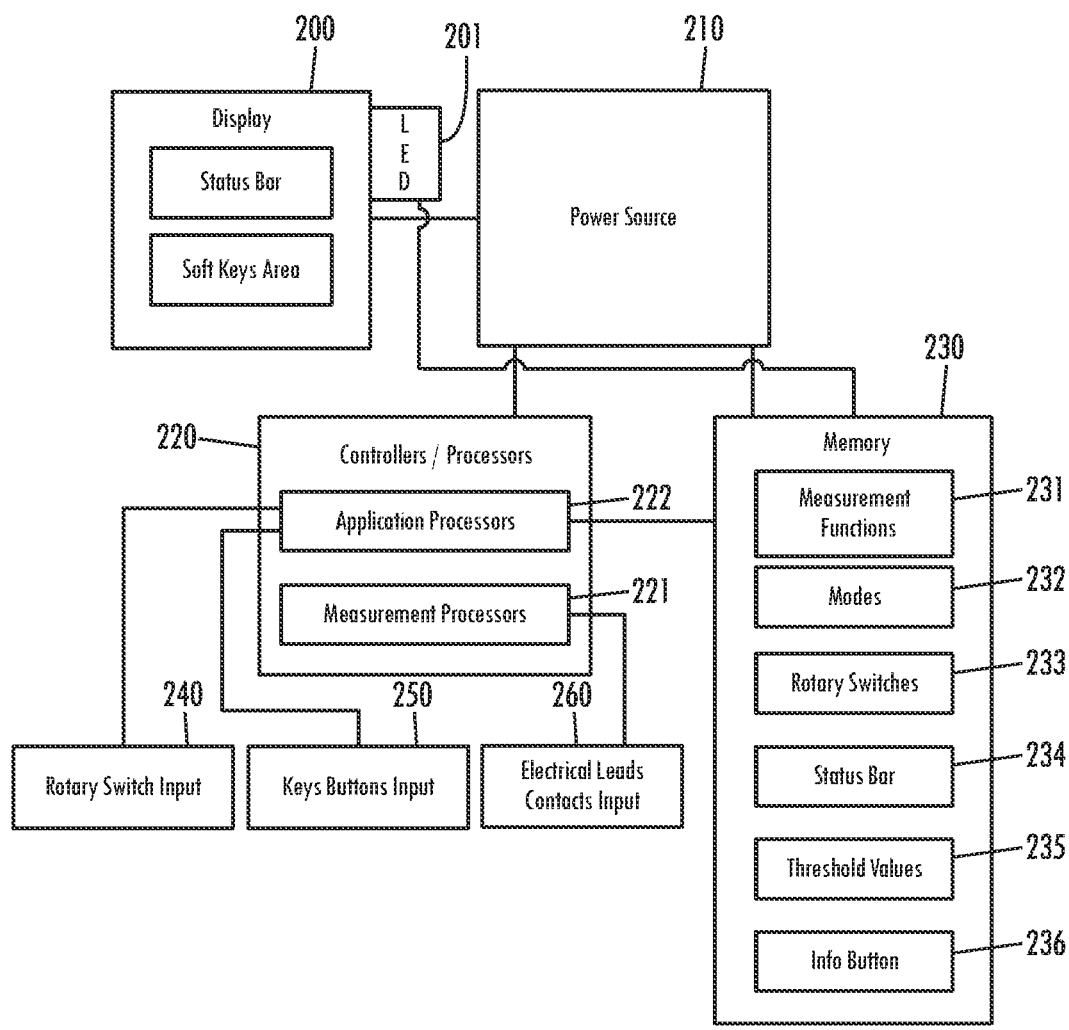
FIG. 2 is a schematic layout of the circuitry and components of one embodiment of a DMM.

Referring to FIG. 2, a schematic layout of a DMM is shown having a digital display 200, a power source 210, controllers/processors 220, a memory 230, and three input types 240, 250, and 260. As described above, display 200 can be an LCD display having an area for a status bar near an upper portion, and an area for defining soft keys at a bottom portion. Display 200 is electrically connected to controllers/processors 220 to receive data to show, and to power source 210 to receive electrical power. In addition, display 200 is back lit by at least one LED 201 or other back lighting source. Power source 210 may comprise batteries (such as four AA batteries noted above), or it can incorporate an AC adapter. The power source is connected to display 200, controllers/processors 220, and memory 230.

The controllers/processors 220 may include at least two processors: the first is a measurement processor 221, which receives input from electrical leads 260, and the second an applications processor 222, which receives input relating to measurement applications, including rotary switch input 240, and a variety of keys and buttons 250 on the face of the DMM. Applications processor 222 also retrieves data from various databases in memory 230 and provides output to display 200.

Memory 230 can be any suitable combination of RAM, ROM, DRAM, Flash, EPROMs, EEPROMs, or any other suitable memory. The memory may be comprised within one chip or may be distributed among a plurality of chips or databases. Memory 230 stores information relating to various measurement functions 231 (e.g., V AC, V DC, ohms, etc.) and modes 232 (e.g., auto-save, relative), as well as information pertaining to rotary switch measurement/mode programming 233, status bar mini-measurement display 234, threshold values 235, and the Info button 236.

Figure 3:
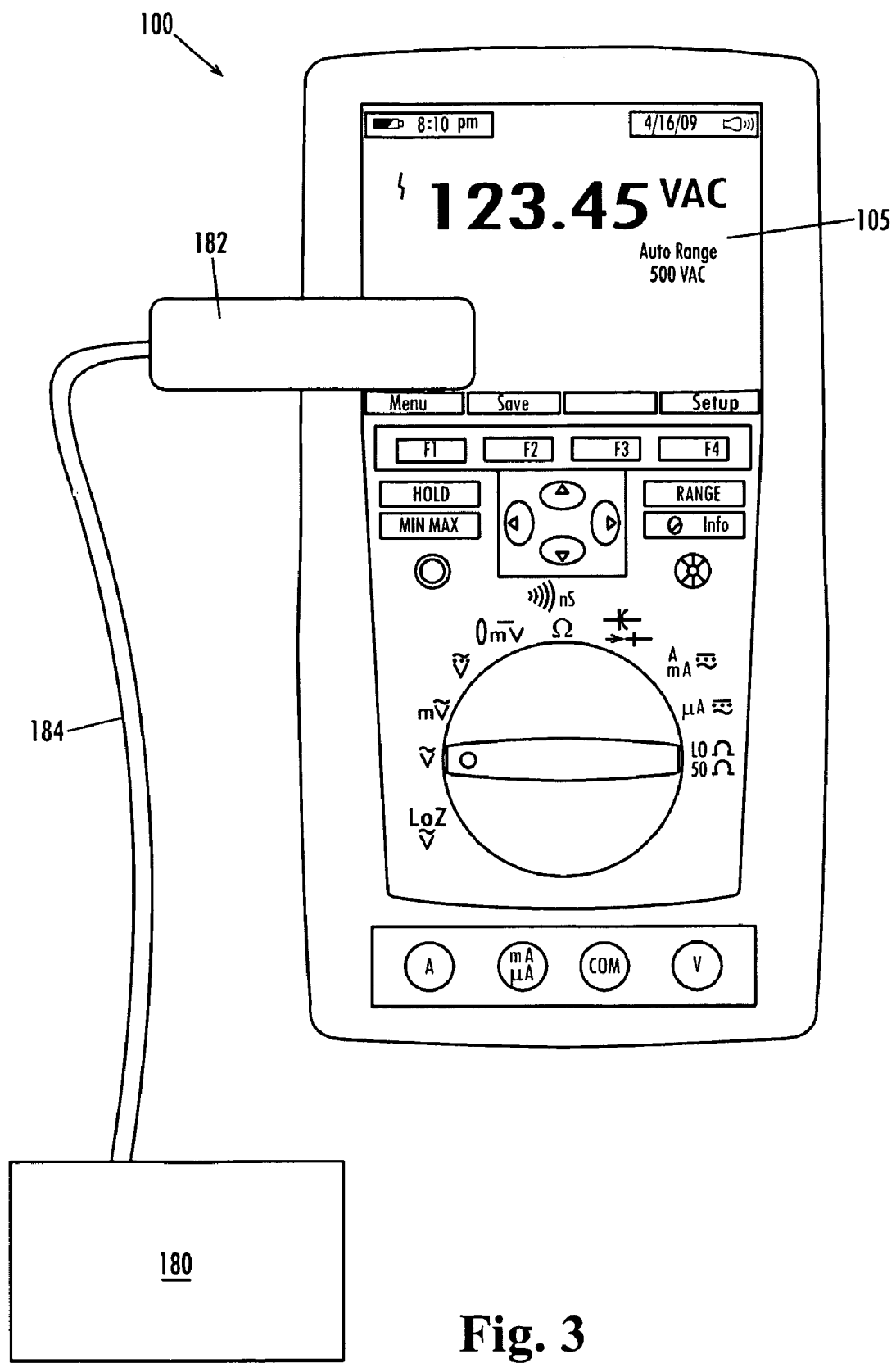
FIG. 3 is a view similar to FIG. 1 but including a remote sensor.

While the output of the DMM may be manually captured by a user taking measurements, capture of output from the DMM may be automated using a light source located on the DMM, such as the display backlight LED, as a mode of transmitting data. In particular, and referring to FIGS. 3 and 4, DMM 100 is shown with a sensor 182 mounted proximate display 105. Sensor 182 includes lead lines 184 that may be operatively coupled to a computer 180. As noted above, display 105 (FIG. 1) or 200 (FIG. 2) contains at least one LED or other backlighting source for backlighting the display.

Generally, a single LED is located on the side of the display and orientated to shine into a plastic diffuser that causes a uniform backlight across the face of the display. The LED location, however, will appear as a bright spot. Thus, the existing backlight may be modified to blink (i.e. modulate a serial data stream, for example, RS232 ASCII) a data stream. Sensor 182 is positioned with respect to display 105 so that the sensor detects the blinking light. While visible light is used in this example, it will be appreciated that other wavelengths may also be used.

Figure 4:
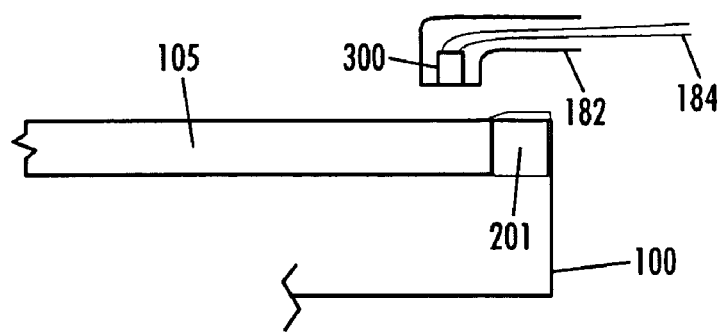
FIG. 4 illustrates a partial side view of the remote sensor of FIG. 3
Figure 5:
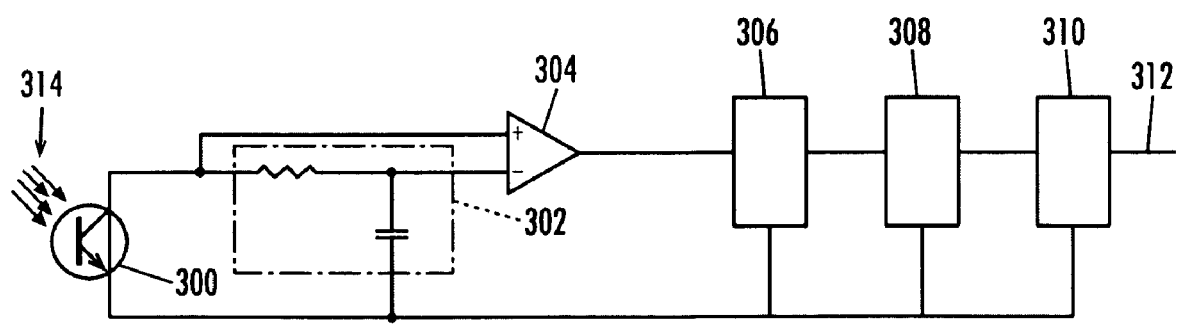
FIG. 5 illustrates a schematic layout of the circuitry and components of one embodiment of a sensor for use with the DMM of FIG. 3.

Referring to FIGS. 4 and 5, sensor 182 preferably comprises a DC biased photovoltaic sensor 300 that detects incoming light 314 and generates an analog signal in response to the detected light. The detected light consists of ambient light in addition to the LED light. The analog signal is split so that one leg is fed through a low pass filter 302, which filters out noise, and then into one input port of an instrumentation amplifier 304. The other leg is fed directly into instrumentation amplifier 304, which yields the difference between the two signals. The resulting signal consists of the data stream output from the LED. The analog data stream consists of a relatively small signal, about 0.5V, which is passed to a comparator 306, which converts the analog signal into a 5v square wave. That is, the comparator acts like a AD converter changing the analog signal into a clean 5V square wave.

The output of comparator 306 is fed into a digital buffer 308, which inverts the signal prior to being received by a level shifter 310. A level shifter (RS232 chip) 310 receives the output of digital buffer 310 and converts the signal from a transistor-to-transistor logic (TTL) signal to an acceptable signal protocol, for example RS232 ASCII. A data signal 312 is output to a receiver, which may be hardwired or wireless. It should be understood that level shifter 310 may be any type of circuit and may include an RF component for converting the signal to a wireless format.

The output signal generated by DMM may be representative of measurement data, the DMM serial number, DMM meter status, etc. During manufacturing, the above described system may be used to check the accuracy of the DMM in response to a known input stimulus. The apparatus of the present invention may also be used for remote monitoring of measurement signals by reading the modulated output of the backlight and transmitting the data signal via a receiver configured to read the signal. One of skill in the art would understand that the invention is not limited to DMMs. For example, any device having a LED or other type of backlighting may be configured to output a modulated signal indicative of information about the device. For instance, an LED on a refrigerator, a backlight or LED in a data meter or any other monitoring device may be used to provide a data stream. In the case of a refrigeration system, the output data from the LED may indicate the operating temperature of the refrigerator and the status of the refrigeration system.

It should also be understood that the system described above may be configured to carry out full duplex communications. In particular, the backlight LED of the DMM may be used as a photo detector to detect a modulated light source by generating low level voltages, for example a 500 mV signal, indicative of detected light. The DMM may be configured to convert the detected analog signal into a digital data signal for configuring the operation of the DMM. In an alternative embodiment, a separate photovoltaic sensor may be integrated into displays 105 and configured to read light generated from a LCD integrated into sensor 182. These signals may be used by the DMM to change operating modes and device configurations. For example, the DMM of the present invention may change from one primary measurement mode to another primary measurement mode. Consequently, in full duplex mode, the device may be used remotely to measure various aspects of a tested product from a remote location without physically having to be present to change the DMM operating mode.

While one or more preferred embodiments of the invention have been described above, it should be understood that any and all equivalent realizations of the present invention are included within the scope and spirit thereof. The embodiments depicted are presented by way of example and are not intended as limitations upon the present invention. Thus, those of ordinary skill in this art should understand that the present invention is not limited to these embodiments since modifications can be made. Therefore, it is contemplated that any and all such embodiments are included in the present invention as may fall within the scope and spirit of the claims.

What we claim:

1. A digital multimeter comprising:
   a. a processor;
   b. a selector for choosing measurement criteria, said selector being operatively coupled to said processor;
   c. an input operatively coupled to said processor, said input being configured to monitor a device;
   d. a backlit display operatively coupled to said processor;
   e. a sensor operatively coupled to said digital multimeter proximate said display;
   wherein said processor is configured to produce a first data signal containing information about the device being monitored;
   said first data signal is modulated to produce an optical indicator on said backlit display that blinks between a first state and a second state that differs from said first state so that said sensor may detect said first and second states;
   wherein said sensor is configured to detect said first and said second states and generate a second data signal representative of said first modulated data signal.

2. The digital multimeter of claim 1, wherein said sensor comprises circuitry configured to distinguish said first and second states from ambient light detected at said sensor.

3. The apparatus of claim 1, wherein said sensor is a photovoltaic sensor and said circuitry for distinguishing comprises:
   a. an amplifier coupled to an output of said photovoltaic sensor;
   b. a comparator coupled to an output of said amplifier; and
   c. a signal converter coupled to an output of said comparator and configured to convert said output signal of said comparator into a common interface signal.

4. The apparatus of claim 3, wherein a light emitting diode backlights said display.

5. A remote monitoring apparatus comprising:
   a. equipment to be monitored from a remote location, said equipment having,
      i. memory;
      ii. a processor operatively coupled to said memory;
      iii. a light operatively coupled to said processor and said memory;
   b. a light sensitive sensor operatively coupled to said equipment and positioned proximate said light;
   wherein said processor is configured to produce a first data signal containing information about said equipment;
   said first data signal is modulated so that said light blinks between an on state and an off state; and
   said sensor is configured to detect said light on state and said light off state and convert said detected light into a second data signal representative of said first data signal.

6. The apparatus of claim 5, wherein said equipment is a digital multimeter comprising a display, wherein said light operates as a backlight for said display.

7. The apparatus of claim 5, wherein
   said equipment further comprises a display; and
   said light is operatively coupled to said display and operates as a backlight for said display.

8. The apparatus of claim 7, wherein said light is a light emitting diode.

9. A remote monitoring apparatus comprising:
   a. equipment to be monitored from a remote location, said equipment having:
      i. memory;
      ii. a processor operatively coupled to said memory; and
      iii. a light operatively coupled to said processor and said memory;
   b. a light sensitive sensor operatively coupled to said equipment and positioned proximate said light;
   wherein said processor is configured to produce a first data signal containing information about said equipment;
   said first data signal is modulated so that said light blinks between an on state and an off state;
   said light sensitive sensor is configured to detect said light on state and said light off state and convert said detected light into a second data signal representative of said first data signal; and
   wherein said light sensitive sensor further comprises:
   a. a photovoltaic sensor;
   b. an amplifier coupled to an output of said photovoltaic sensor;
   c. a comparator coupled to an output of said amplifier; and
   d. a signal converter coupled to an output of said comparator and configured to convert said output signal of said comparator into a common interface signal.

10. The apparatus of claim 9, wherein said common interface signal is RS232 ASCII.

11. The apparatus of claim 9, wherein said signal converter is a level shifter.

12. The apparatus of claim 9, said light sensitive sensor further comprising a low pass filter intermediate said photovoltaic sensor and at least one input of said amplifier.

13. A remote measuring device comprising:
    a. a measuring device having
       i. a processor, said processor configured to modulate a first data signal to produce command signals;
       ii. memory operatively coupled to said processor,
       iii. an input operatively coupled to said processor, said input configured to measure a desired parameter of interest to the user,
       iv. a display operatively coupled to said processor and configured to display measurement data, and
       v. a backlight operatively coupled to said processor and configured to switch between an on state and an off state in response to said command signals from said processor, and
    b. a first light sensitive sensor operatively coupled to said measuring device proximate said backlight,
    wherein said sensor is configured to detect said light on state and said light off state and convert said received light into a second data signal representative of said first data signal.

14. The remote measuring device of claim 13, wherein said measuring device is a digital multimeter.

15. The remote measuring device of claim 13, wherein said light is a light emitting diode.

16. The remote measuring device of claim 13, wherein said light sensitive sensor further comprises:
    a. a photovoltaic sensor;
    b. an amplifier coupled to an output of said photovoltaic sensor;
    c. a comparator coupled to an output of said amplifier; and
    d. a signal converter coupled to an output of said comparator and configured to convert said output signal of said comparator into a common interface signal.

17. The apparatus of claim 16, wherein said signal converter is a level shifter.

18. The remote measuring device of claim 16, wherein said common interface signal is RS232 ASCII.

19. The remote measuring device of claim 16, said measuring device further comprising a second light sensitive sensor for detecting a second light operatively coupled to said first light sensitive sensor.

20. The remote measuring device of claim 19, wherein said light emitting diode is configured to operate as said second light sensitive sensor.

21. The remote measuring device of claim 20, wherein said remote measuring device operates in a duplex mode by sending and receiving data signals via said light emitting diode.

22. The remote measuring device of claim 19, wherein said second light sensitive sensor is a photovoltaic sensor operatively coupled to said processor.

23. The remote measuring device of claim 13 further comprising a computer coupled to said first light sensitive sensor, said computer being configured to receive said second data signal.

24. The apparatus of claim 16, wherein said signal converter further comprises an RF component for converting said output signal into a wireless format.

25. A method for monitoring a detected electrical parameter using a digital multimeter having a backlight signal modulated in a manner that indicates the electrical parameter, said method comprising the steps of:
   positioning a light sensitive sensor proximate said digital multimeter in a position to detect said backlight signal;
   receiving at said processor a first data signal representative of said detected electrical parameter;
   modulating said first data signal to modulate said backlight signal in a blinking manner, wherein said blinking is representative of said first data signal;
   detecting ambient light and light emitted from said backlight at said light sensitive sensor;
   converting said emitted light into a second data signal representative of said first data signal.

26. The method of claim 25, wherein said step of converting comprises filtering said ambient light from said emitted light.

* * * * *